United States Patent [19]

Karpinski

[11] Patent Number: 5,311,535
[45] Date of Patent: May 10, 1994

[54] MONOLITHIC LASER DIODE ARRAY PROVIDING EMISSION FROM A MINOR SURFACE THEREOF

[76] Inventor: Arthur A. Karpinski, Barker Rd., Jordan, N.Y. 13080

[21] Appl. No.: 920,658

[22] Filed: Jul. 28, 1992

[51] Int. Cl.$^5$ .......................... H01S 3/19; H01S 3/045
[52] U.S. Cl. .......................................... 372/50; 372/36
[58] Field of Search ............................... 372/36, 50, 75

[56] References Cited

U.S. PATENT DOCUMENTS 4,881,237  11/1989  Donnelly .............................. 372/50

Primary Examiner—James W. Davie
Attorney, Agent, or Firm—Sughrue, Mion, Zinn, Macpeak & Seas

[57] ABSTRACT

A laser diode array having a grooved substrate with one or more laser diode bars disposed in the substrate grooves. When mounted in the substrate, the bars emit light in a direction perpendicular to the minor surface of the substrate. Additional structure is provided to channel the light output of the array. The substrate may be comprised of a number of materials, including: ceramic; semiconductor; crystal, such as diamond; doped ceramic; doped semiconductor; doped crystal; composites, composed of conductive upper layers and nonconductive lower layers, or the like. In certain embodiments metallization is provided in the grooves for purposes of conduction and for attachment of the laser diode bars. In certain embodiments metallization may be provided in the grooves for purposes of attaching the laser diode bars securely; the conductive nature of the substrate providing the required electrical conductivity.

20 Claims, 4 Drawing Sheets

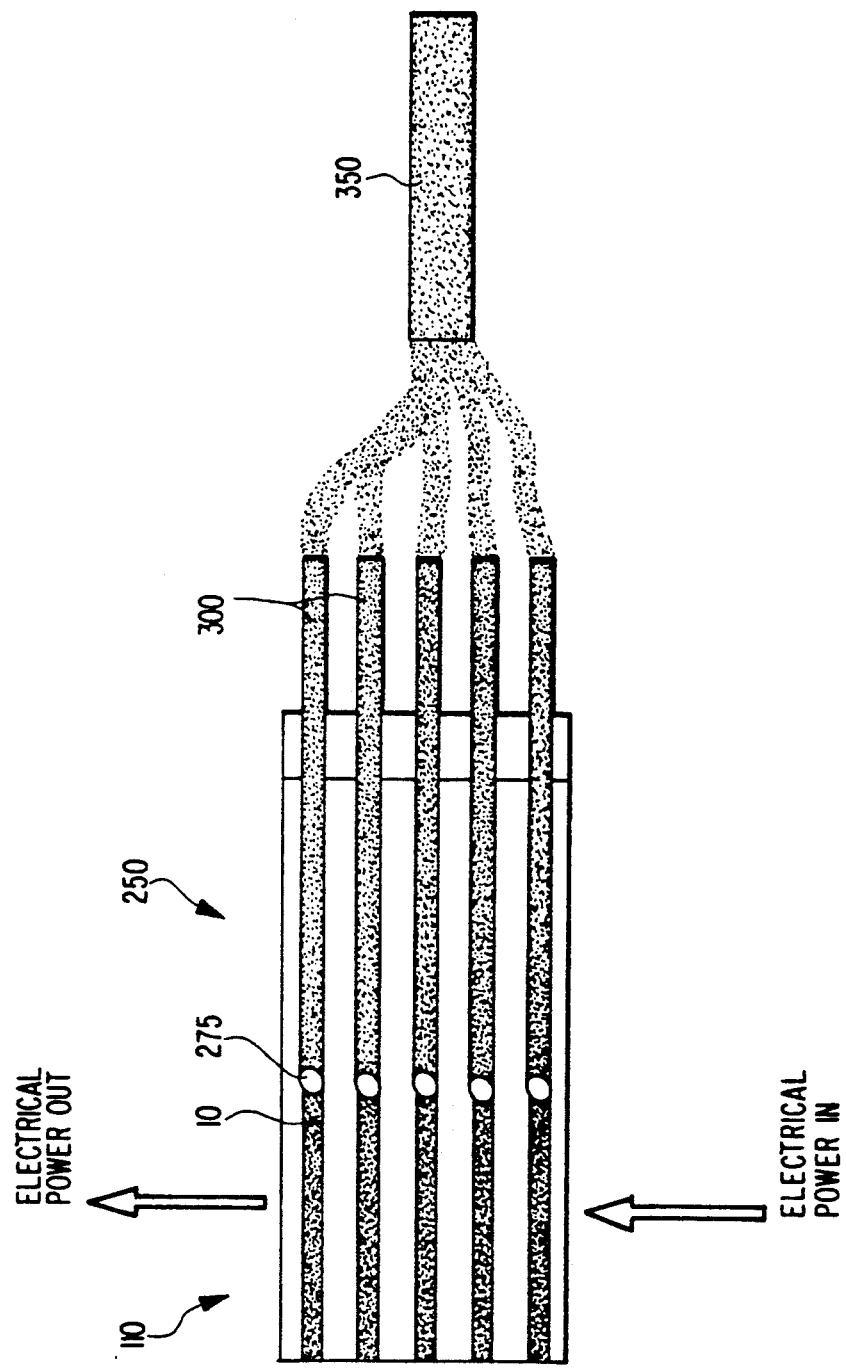

MONOLITHIC LASER DIODE ARRAY PROVIDING EMISSION FROM A MINOR SURFACE THEREOF

BACKGROUND OF THE INVENTION

The present invention, the latest in a series of developments by the present inventor, these developments having led to U.S. Pat. Nos. 5,040,187 and 5,128,951 and related application Ser. No. 07/827,884, relates to a laser diode array in which radiation is emitted from a minor surface of the array. To provide relevant background and disclosure, the foregoing patent and copending applications are incorporated herein by reference.

The inventor's work in the field started from an investigation of possible improvements to a known "Rack & Stack" assembly process for laser diode arrays, in which the inventor was involved. This technique, which still is being used rather widely today, is far more expensive than the techniques disclosed in the above-mentioned copending applications and patent.

In the "Rack & Stack" process, individual one-dimensional (1 D) subarrays are mounted on a backplane to form a two-dimensional (2 D) array. The number of individual parts involved makes it very difficult to achieve high volume production, particularly since the number of assembly steps is large, and yield has tended to be relatively low. Many of the individual assembly steps require careful alignment of the individual subarrays, contributing to longer required assembly time and lower yield. Further, the 1 D subarrays are not reworkable; if part of a subarray is flawed, the entire assembly must be scrapped, as individual laser diodes in the subarrays cannot be replaced.

Against this backdrop, prior work by the present inventor has focused on facilitating fabrication of these laser diode arrays, comprised of a plurality of laser diode bars disposed such that the radiation emitting surface of each of the laser diode bars is parallel to the upper major surface of the array substrate so as to emit radiation in a direction perpendicular to the upper major surface of the substrate. The improvements are disclosed and claimed in the referenced copending applications and patent. In the arrays according to the invention which is the subject of this application, the bars are disposed such that the radiation emitting surface of each of the laser diode bars is parallel to the minor surface of the array substrate so as to emit radiation in a direction perpendicular to the minor surface of the substrate.

Fabrication of the diodes per se is not an aspect of any of these inventions; rather, these diodes simply are commercially available products. The present inventor's work in this area has focused on types of substrates, including various techniques for providing substrates having the necessary physical and electrical characteristics. In the above-mentioned U.S. patent, a non-conductive monolithic substrate is provided with a plurality of grooves in which a metallized layer is formed to provide both electrical conductivity and an attachment surface for the laser diodes, which are soldered into the metallized grooves.

Later developments, such as disclosed in U.S. Pat. No. 5,128,951, provide a conductive substrate (such as a highly doped semiconductor), in which the metallized layer, which may be needed for attachment purposes, no longer is necessary for electrical conductivity. Instead, the conductive substrate, which may be monolithic in nature (having a doped upper portion and an undoped lower portion in one embodiment), or which may instead be of two-piece construction (having, for example, a conductive upper portion and an insulative lower portion), provides the necessary conduit for current flow to the laser diode bars.

Future array designs will require laser light emission from the minor surface of the array. The inventor has considered the desirability of providing a laser diode assembly such that light would be emitted in a direction from a minor surface of the substrate.

In the course of developing improved laser diode assemblies, the inventor also has considered different materials for use in the substrate in which the laser diode bars would be mounted. For different types of industrial and/or military applications, he has learned that different types of materials may be preferable.

SUMMARY OF THE INVENTION

In view of the foregoing, it is one object of the invention to provide a one-dimensional laser diode array (having a single groove) or a two-dimensional laser diode array (having multiple grooves) having a structure in which light is emitted in a direction perpendicular to a minor surface of a grooved substrate in which laser diode bars are mounted. Such arrays have various applications, one of which is direct pumping of fiberoptics.

The substrate in which the bars are mounted may be comprised of any of the materials specifically disclosed in any of the afore-mentioned copending applications and U.S. patent. In addition, the inventor has determined that boron nitride is an attractive choice.

Several preferred embodiments are disclosed herein, including direct fiber optic applications of the invention.

BRIEF DESCRIPTION OF THE DRAWINGS

The foregoing and other objects and features of the invention now will be described in detail by way of a preferred embodiment, depicted in the accompanying drawings, in which:

FIG. 8 shows the laser diode bars and fiber optics mounted in the same substrate.

DETAILED DESCRIPTION OF THE PREFERRED EMBODIMENTS

Figure 1:
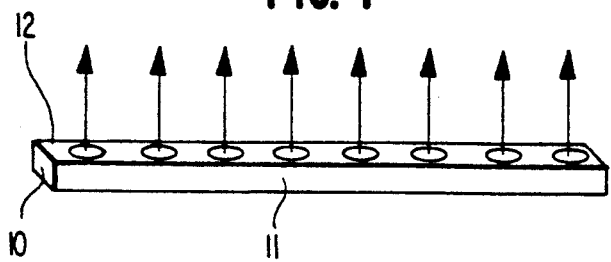
FIG. 1 illustrates the design and fabrication of laser diode bars such as those used in the above-mentioned copending applications and issued patent, wherein light is emitted from a major surface of the bars.

Looking first at FIG. 1, a laser diode bar 10 which emits radiation from a plurality of light emission areas on a major surface thereof as shown typically may be 100 to 10,000 microns long, 75-200 microns thick, and 300-750 microns wide. Each bar has an "N" side 11 and a "P" side 12. Metallization compatible with indium/-lead and tin/lead solders, for example, may be provided.

Figure 3:
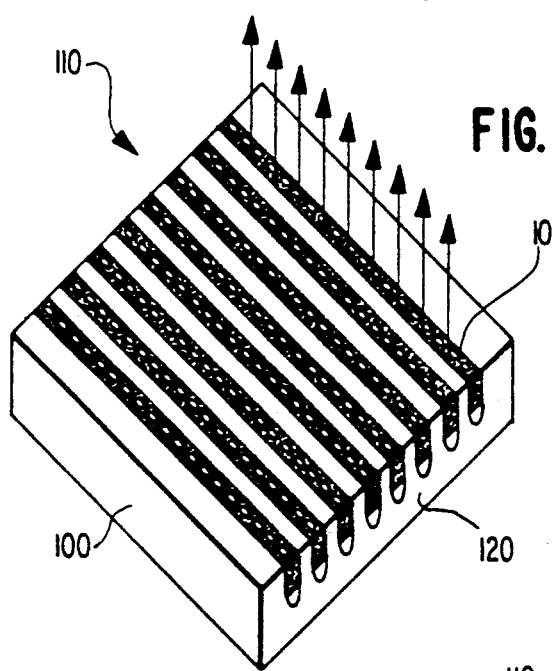
FIG. 3 illustrates laser diode array fabrication in accordance with the techniques disclosed in the above-mentioned applications and issued patent, wherein radiation is emitted in a direction perpendicular to a major surface of the substrate.

FIG. 3 shows an example of a laser diode array 100 in accordance with the above-mentioned copending applications and issued patent. This array employs one or more laser diode bars 10, as shown in FIG. 1. Light is emitted in a direction perpendicular to a major surface 110 of the substrate shown, but not from the "ends" of the laser bars, i.e. not in a direction perpendicular to a minor surface 120 of the array.

Figure 2:
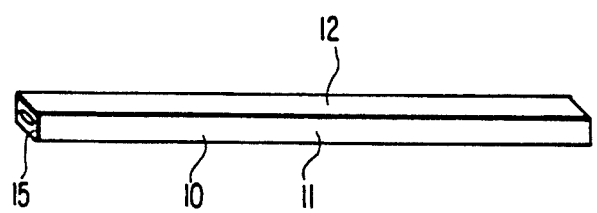
FIG. 2 illustrates the design and fabrication of laser diode bars for use in the present invention, wherein light is emitted from a minor surface of the bars.

FIG. 2 shows a laser diode bar 10' for use with the present invention, in which the end has a light emission area 15. Similar to the bar 10 of FIG. 1, each bar has an "N" side 11' and a "P" side 12'. The dimensions of the bar may be substantially the same as those of the bar of FIG. 1, the only substantive difference being the position of the light emission area in the bars. As in the bar of FIG. 1, metallization compatible with indium/lead and tin/lead solders, for example, is provided. It should be noted that fabrication of these bars is not an object of the invention; rather, the bars are readily obtainable.

Figure 4:
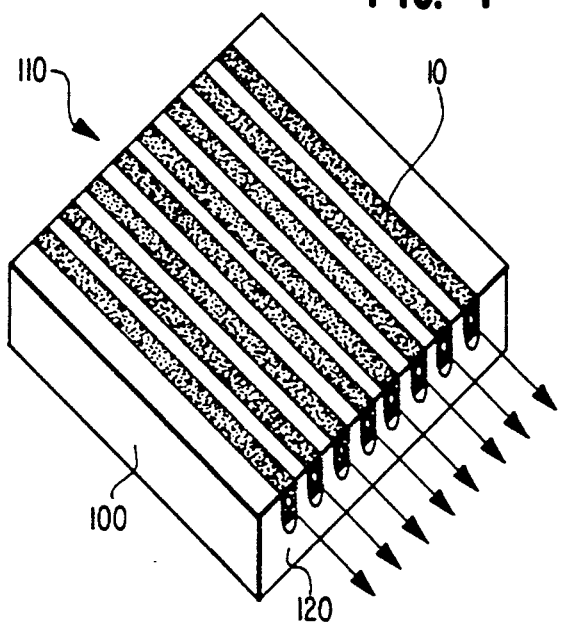
FIGS. 4 and 5 illustrate laser diode array fabrication in accordance with the present invention, wherein radiation is emitted in a direction perpendicular to a minor surface of the substrate.
Figure 5:
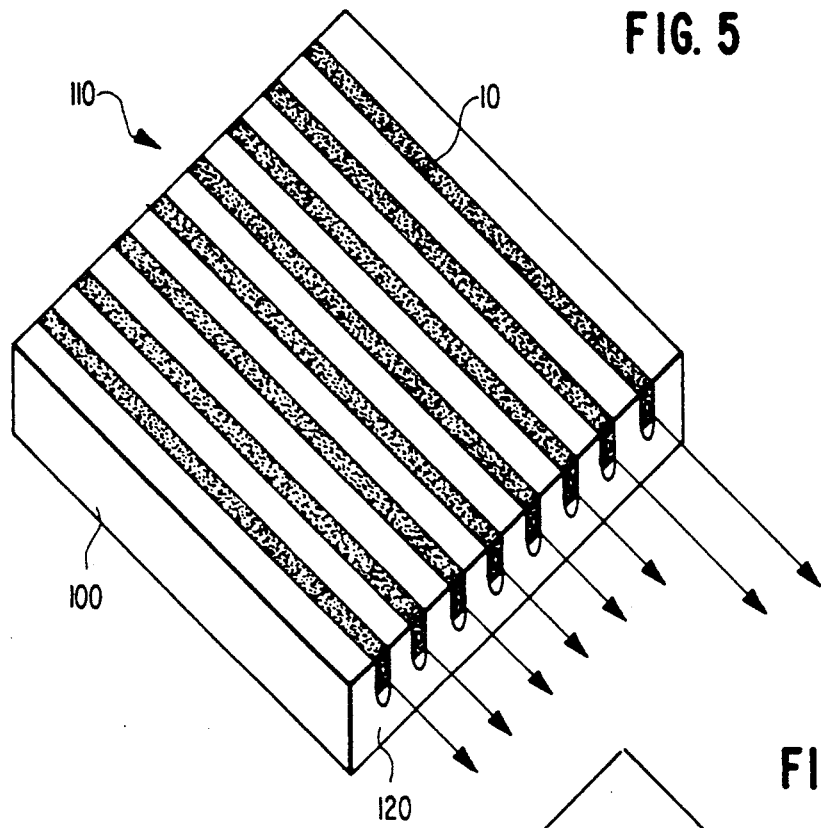

FIGS. 4 and 5 show examples of the inventive laser diode array. This array employs one or more laser diode bars 10', as shown in FIG. 2. Light is emitted in a direction perpendicular to a minor surface 120' of the substrate shown.

FIG. 5 provides a more detailed view of what is shown in FIG. 4, and highlights some of the assembly aspects of the invention. The laser diode bars 10' are inserted in the grooves, and secured in place, the solder (for example, indium/lead or tin/lead solder) or adhesive attaching to a metallized layer in each groove.

Figure 6:
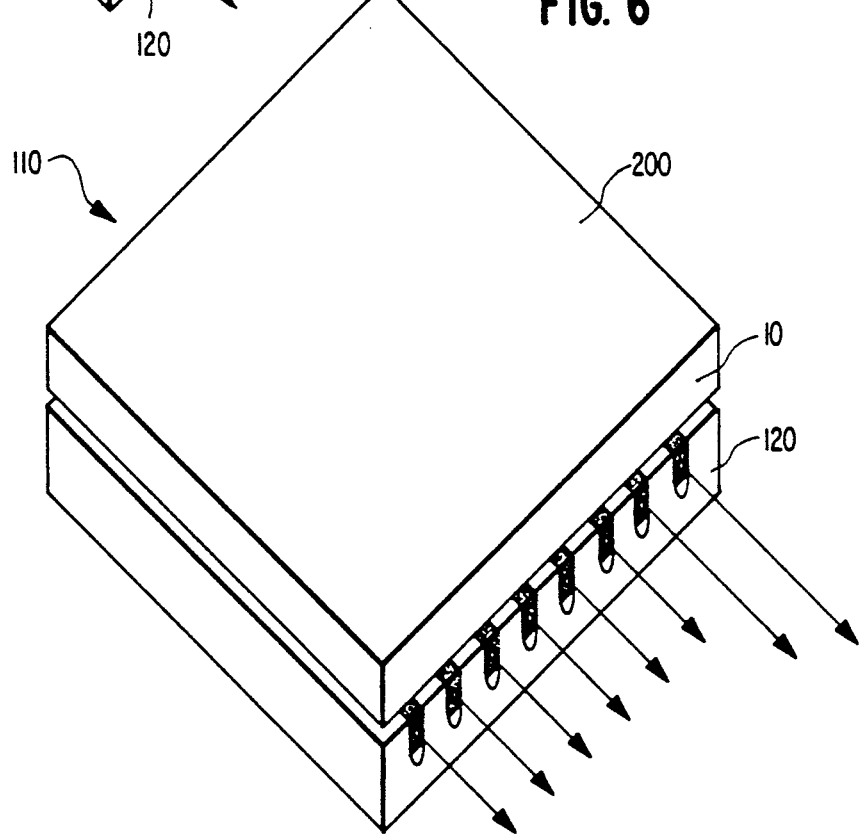
FIG. 6 shows one aspect of assembly of the inventive laser diode array with an optional heat spreader.

Because light is not emitted from a major surface 110' of the array, placement of a heat spreader (discussed, for example, in U.S. Pat. No. 5,040,187) is not limited to an underside of the array. Rather, as shown for example in FIG. 6, a heat spreader 200 (made, for example, of beryllium oxide or other suitable material) is disposed on a top portion of the array. This arrangement permits heat conduction and/or electrical interconnects to either or both major surface(s) of the array, depending on whether the heat spreader 200 is put on the top, bottom or both major surfaces. Attachment of the heat spreader 200 and any other associated structure disclosed in the above-mentioned copending applications and issued patent are described in detail therein.

Thus, in accordance with a first embodiment of the invention, a monolithic substrate has at least one groove formed therein. Metallization is provided in the grooves to promote current conductivity and to facilitate attachment of the diodes in the grooves. At least one laser diode is fitted into the groove, with multiple diodes for multiple grooves. According to one implementation of this embodiment, the substrate may be flexible, bending so as to open the grooves sufficiently to allow insertion of the diodes thereinto. According to another implementation, the grooves may be slightly larger than the laser diodes to be inserted therein; in that event, adhesive or other bonding material, such as solder, preferably is used to secure the laser diode within the groove. It is within the contemplation of the invention to combine these attachment approaches.

It should be noted that, while reference has been made to a single groove, in a preferred embodiment multiple grooves are provided in the substrate. Also, while the illustrated substrate is flat, the invention is not so limited in application. Rather, a curved substrate may be employed, as desired, though such might be particularly useful in an application such as the copending applications and issued patent, in which the laser diode bars emit radiation from a major surface, not a minor surface thereof.

In accordance with a second embodiment, the substrate comprises two layers, a first layer being substantially insulative, and a second layer being substantially conductive. The insulative and conductive layers are bonded, grown, plated, or otherwise attached in any of a number of known manners, details of which will be readily apparent to the ordinarily skilled artisan, and which accordingly need not be described in detail here. Grooves are cut, etched, grown, pressed, or otherwise formed in the conductive layer, and may extend slightly into the insulative layer. A layer to facilitate attachment may be provided in the grooves. Laser diode bars 10' as shown in FIG. 2 are disposed in the grooves. Again, light emission is in a direction perpendicular to a minor surface of the substrate. As in the first embodiment, substrate flexibility is optional, and accordingly a combination of attachment approaches may be employed. This two-layer approach is disclosed in greater detail in U.S. Pat. No. 5,128,951.

According to a third embodiment, a monolithic substrate may be employed, in which an upper portion of the substrate is substantially conductive, and a lower portion is substantially non-conductive, or insulative. The differential in conductivity may be accomplished by doping the upper portion of the substrate suitably. Grooves are formed as in the other embodiments. Metallization is provided in the grooves as in the second embodiment, and the laser diode bars are secured as in either of the first two embodiments. This embodiment also is disclosed in greater detail in U.S. Pat. No. 5,128,951.

Preferred materials for the conductive layer of the second embodiment, or for the monolithic substrate of the third embodiment, include silicon, gallium arsenide, or industrial diamond. Doping techniques are well known in the art, and so need not be detailed here. Boron nitride also is an attractive choice.

The invention described herein has applications in many areas in which high power semiconductor laser devices are used, including satellite communication, direct energy applications, remote sensing of atmospheric conditions, range finding, and isotope separation. Other applications include optical recording, computing, laser machining, level sensing, remote sensing, and the interfacing of fiberoptic cables and laser diodes, this last application being pertinent in the communications, laser cutting and sealing, general illumination, and fiber optic pumping fields.

Figure 7:
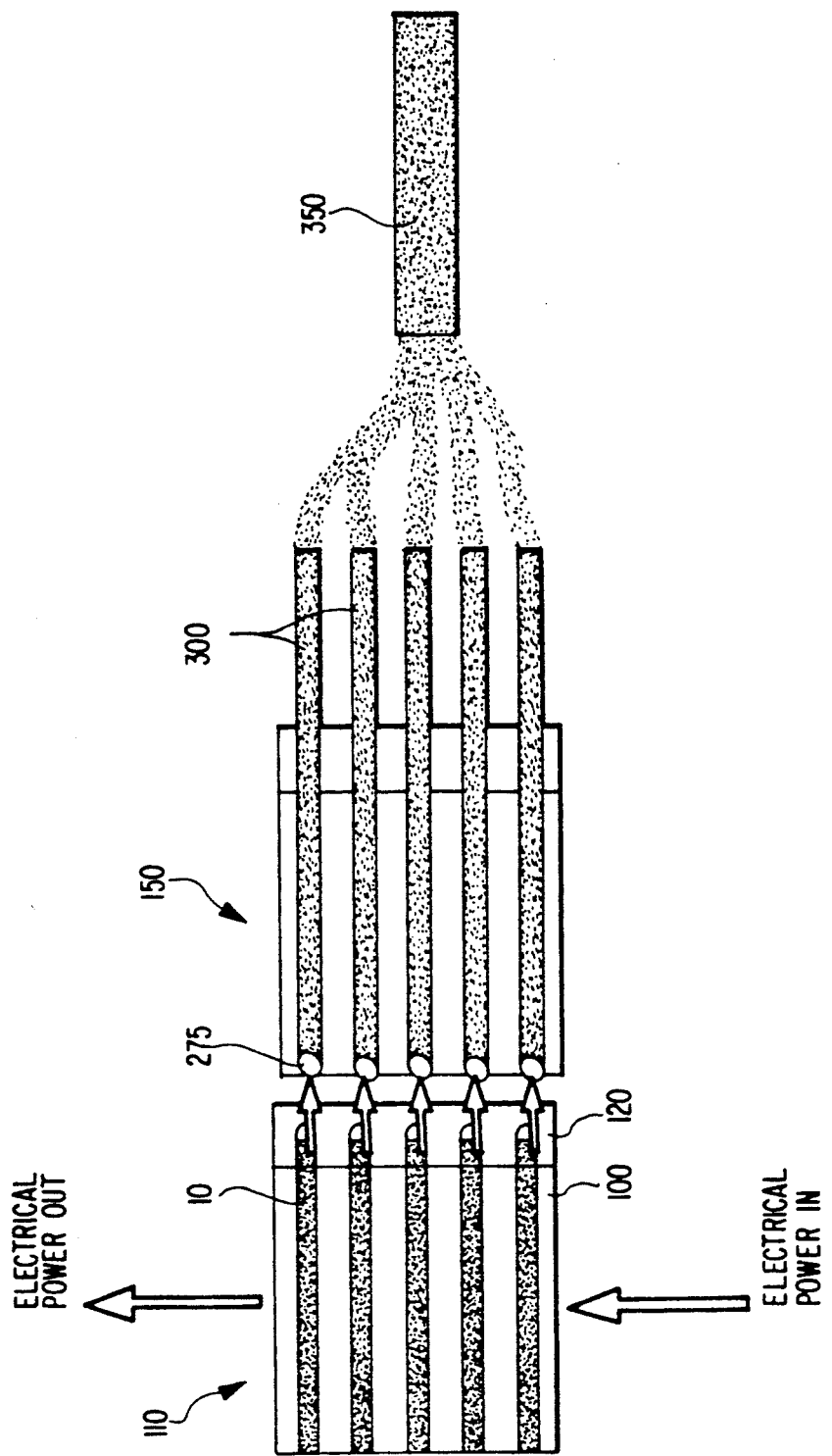
FIG. 7 shows a typical application of the inventive laser diode array where light output from the laser diodes is interfaced into fiber optics.

Applications of the inventive array are shown in FIGS. 7 and 8, wherein light emitted from the mounted bars of the array is directed into a fiberoptic assembly. Since the dimensional locations of the laser bars are controlled finely by their mounting in the grooved substrate, it is a relatively straightforward matter to add an optical fiber mounting assembly as shown, wherein optical fibers are mounted in a substrate with the same center to center distance between fibers as in the laser diode array. Thus, alignment of the fibers with the bars is facilitated, promoting low cost, high volume production of the laser diode pumped fiberoptic assemblies.

Looking more closely at FIG. 7, which shows one embodiment of the inventive pumping assembly, a first substrate 100 has laser diode bars 10' inserted in grooves, with a minor surface 120' of the array constituting the emission surface. A second substrate 150 has individual optical fibers 300 from an optical fiber bundle 350 disposed in respective grooves, with ends of the fibers 300 confronting respective emission surfaces of the laser diode bars 10'. Micro-lenses 275 optionally may be provided to aid in focusing light from the laser diode bars 10' into the fibers 300.

In FIG. 8, ends of the optical fibers 300 confront respective emission surfaces of the laser diode bars 10', the only difference being the use of a single substrate 250 with laser diode bars 10' and optical fibers 300 being in the same grooves. As in FIG. 7, micro-lenses 275 optionally may be provided.

The type of pumping assembly shown in FIGS. 7 and 8 then can be used in a variety of applications, for example, simple illumination sources, or as light guides for other applications, such as fiberoptic pumping of solid state laser systems, communication systems, or even medical applications. In medical types of applications, the laser light from the array would be used as the energy source for cutting or cauterizing. Such cutting would be equally applicable in industrial environments as well.

While preferred embodiments of the invention have been described above in detail, various changes and modifications within the scope and spirit of the invention will be apparent to those of working skill in this technological field. Thus, the invention is to be considered as limited only by the scope of the appended claims.

What is claimed is:

1. A monolithic laser diode array comprising:
   a monolithic substrate having upper and lower major surfaces and at least one minor surface extending between said upper and lower major surfaces, at least one groove having substantially vertical side walls being formed in said upper major surface and extending to said at least one minor surface;
   a metallized layer disposed along said side walls of said at least one groove to form at least one metallized groove; and
   at least one laser diode bar, mounted in said at least one metallized groove such that an emission surface of said at least one laser diode bar is parallel to said at least one minor surface.

2. An array as claimed in claim 1, said substrate having a plurality of grooves formed therein, said grooves having substantially vertical side walls and extending to said at least one minor surface, said array further comprising a plurality of laser diode bars, said metallized layer being provided in each of said plurality of grooves, said plurality of laser diode bars being mounted in respective ones of said plurality of grooves.

3. An array as claimed in claim 1, further comprising:
   a second substrate having upper and lower major surfaces and at least one minor surface extending between said upper and lower major surfaces of said second substrate, at least one groove having substantially vertical side walls being formed in said upper major surface of said second substrate and extending to said at least one minor surface; and
   at least one optical fiber mounted in said at least one groove in said second substrate, said second substrate being disposed relative to said substrate containing said at least one laser diode bar such that an end of said at least one optical fiber confronts said emission surface of said at least one laser diode bar.

4. An array as claimed in claim 2, further comprising:
   a second substrate having upper and lower major surfaces and at least one minor surface extending between said upper and lower major surfaces of said second substrate, a plurality of grooves having substantially vertical side walls being formed in said upper major surface of said second substrate and extending to said at least one minor surface so as to correspond in pitch and number to said plurality of grooves formed in the substrate containing said laser diode bars; and
   a plurality of optical fibers mounted in said plurality of grooves in said second substrate, said second substrate being disposed relative to said substrate containing said plurality of laser diode bars such that an end of each of said plurality of optical fibers confronts the respective emission surface of each of said plurality of laser diode bars.

5. A laser diode array comprising:
   a substrate having upper and lower major surfaces and at least one minor surface extending between said upper and lower major surfaces, at least one groove having substantially vertical side walls being formed in said upper major surface and extending to said at least one minor surface, said substrate comprising a substantially nonconductive lower portion with a conductive layer formed over said substantially nonconductive lower portion of said substrate; and
   at least one laser diode bar, mounted in said at least one groove such that an emission surface of said at least one laser diode bar is parallel to said at least one minor surface.

6. An array as claimed in claim 5, said substrate having a plurality of grooves formed therein, said grooves having substantially vertical side walls and extending to said at least one minor surface, said array further comprising a plurality of laser diode bars, said plurality of laser diode bars being mounted in respective ones of said plurality of grooves.

7. An array as claimed in claim 5, further comprising:
   a second substrate having upper and lower major surfaces and at least one minor surface extending between said upper and lower major surfaces of said second substrate, at least one groove having substantially vertical side walls being formed in said upper major surface of said second substrate and extending to said at least one minor surface; and
   at least one optical fiber mounted in said at least one groove in said second substrate, and said second substrate being disposed relative to said substrate containing said at least one laser diode bar such that an end of said at least one optical fiber confronts said emission surface of said at least one laser diode bar.

8. An array as claimed in claim 6, further comprising:
   a second substrate having upper and lower major surfaces and at least one minor surface extending between said upper and lower major surfaces of said second substrate, a plurality of grooves having substantially vertical side walls being formed in said upper major surface of said second substrate and extending to said at least one minor surface so as to correspond in pitch and number to said plurality of grooves formed in the substrate containing said laser diode bars; and a plurality of optical fibers mounted in said plurality of grooves in said second substrate, said second substrate being disposed relative to said substrate containing said plurality of laser diode bars such that an end of each of said plurality of optical fibers confronts the respective emission surface of each of said plurality of laser diode bars.

9. A monolithic laser diode array comprising:
a monolithic substrate having upper and lower major surfaces, at least one minor surface extending between said upper and lower major surfaces, at least one groove having substantially vertical side walls being formed in said upper major surface and extending to said at least one minor surface, said monolithic substrate having upper and lower portions, said lower portion of said monolithic substrate being substantially undoped and electrically nonconductive, and said upper portion of said monolithic substrate being highly doped and electrically conductive; and at least one laser diode bar, mounted in said at least one groove such that an emission surface of said at least one laser diode bar is parallel to said at least one minor surface.

10. An array as claimed in claim 9, said substrate having a plurality of grooves formed therein, said grooves having substantially vertical side walls and extending to said at least one minor surface, said array further comprising a plurality of laser diode bars, said plurality of laser diode bars being mounted in respective ones of said plurality of grooves.

11. An array as claimed in claim 9, further comprising:
a second substrate having upper and lower major surfaces and at least one minor surface extending between said upper and lower major surfaces of said second substrate, at least one groove having substantially vertical side walls being formed in said upper major surface of said second substrate and extending to said at least one minor surface; and at least one optical fiber mounted in said at least one groove in said second substrate, said second substrate being disposed relative to said substrate containing said at least one laser diode bar such that an end of said at least one optical fiber confronts said emission surface of said at least one laser diode bar.

12. An array as claimed in claim 10, further comprising:
a second substrate having upper and lower major surfaces and at least one minor surface extending between said upper and lower major surfaces of said second substrate, a plurality of grooves having substantially vertical side walls being formed in said upper major surface of said second substrate and extending to said at least one minor surface so as to correspond in pitch and number to said plurality of grooves formed in the substrate containing said laser diode bars; and a plurality of optical fibers mounted in said plurality of grooves in said second substrate, said second substrate being disposed relative to said substrate containing said plurality of laser diode bars such that an end of each of said plurality of optical fibers confronts the respective emission surface of each of said plurality of laser diode bars.

13. A monolithic laser diode array comprising:
a monolithic substrate having upper and lower major surfaces, at least one minor surface extending between said upper and lower major surfaces, and at least one groove having substantially vertical side walls formed in said upper major surface along a length of said substrate and extending to said at least one minor surface;

a metallized layer disposed along at least a portion of a length of said side walls of said at least one groove to form at least one metallized groove;

at least one laser diode bar, mounted in a metallized portion of said at least one groove such that an emission surface thereof is parallel to said at least one minor surface; and at least one optical fiber mounted in a remaining portion of said at least one groove opposite said at least one laser diode bar so that one end of said at least one optical fiber is adjacent to the emission surface of said at least one laser diode bar.

14. An array as claimed in claim 13, said monolithic substrate having a plurality of grooves having substantially vertical side walls disposed therein, said side walls extending to said at least one minor surface, said array further comprising a plurality of laser diode bars and a plurality of optical fibers, said metallized layer being provided along at least a portion of a length of said side walls of said plurality of grooves to form a plurality of metallized grooves, said plurality of laser diode bars being mounted in said plurality of metallized grooves and said plurality of optical fibers being mounted in respective remaining portions of said plurality of grooves such that one end of each of said optical fibers is adjacent to an emission surface of a respective one of said plurality of laser diode bars.

15. A laser diode array comprising:
a substrate having upper and lower major surfaces and at least one minor surface extending between said upper and lower major surfaces, at least one groove having substantially vertical side walls being formed in said upper major surface along a length of said substrate and extending to said at least one minor surface, said substrate comprising a substantially nonconductive lower portion with a conductive layer formed over said substantially nonconductive lower portion of said substrate;

at least one laser diode bar, mounted in said at least one groove such that an emission surface thereof is parallel to said at least one minor surface; and at least one optical fiber mounted in a remaining portion of said at least one groove opposite the said at least one laser diode bar so that one end of said at least one optical fiber is adjacent to the emission surface of said at least one laser diode bar.

16. An array as claimed in claim 15, said substrate having a plurality of grooves formed therein, said grooves having substantially vertical side walls and extending to said at least one minor surface, said array further comprising a plurality of laser diode bar and a plurality of optical fibers, said plurality of laser diode bars being mounted in said grooves, and said plurality of optical fibers being mounted in respective remaining portions of said plurality of grooves such that one end of each of said optical fibers is adjacent to an emission surface of a respective one of said plurality of laser diode bars.

17. A monolithic laser diode array comprising:

a monolithic substrate having upper and lower major surfaces and at least one minor surface extending between said upper and lower major surfaces, at least one groove having substantially vertical side walls being formed in said upper major surface along a length of said substrate and extending to said at least one minor surface;

the monolithic substrate having upper and lower portions, said lower portion of said substrate being substantially undoped and electrically nonconductive, and said upper portion being highly doped and electrically conductive;

at least one laser diode bar, mounted in said at least one groove such that an emission surface thereof is parallel to said at least one minor surface; and at least one optical fiber mounted in a remaining portion of said at least one groove opposite the said at least one laser diode bar so that one end of said at least one optical fiber is adjacent to the emission surface of said at least one laser diode bar.

18. An array as claimed in claim 17, said monolithic substrate having a plurality of grooves formed therein, said grooves having substantially vertical side walls and extending to said at least one minor surface, said array further comprising a plurality of laser diode bar and a plurality of optical fibers, said plurality of laser diode bars being mounted in said grooves, and said plurality of optical fibers being mounted in respective remaining portions of said plurality of grooves such that one end of each of said optical fibers is adjacent to an emission surface of a respective one of said plurality of laser diode bars.

19. An array as claimed in claim 1, 5, 9, 3, 7, 11, 13, 15, or 17, further comprising a heat spreader for dissipating heat emitted by said laser diode bar.

20. An array as claimed in claim 2, 6, 10, 4, 8, 12, 14, 16, or 18, further comprising a heat spreader for dissipating heat emitted by said laser diode bars.

* * * * *